United States Patent [19]

Ariizumi

[11] Patent Number: 4,755,864
[45] Date of Patent: Jul. 5, 1988

[54] SEMICONDUCTOR READ ONLY MEMORY DEVICE WITH SELECTIVELY PRESENT MASK LAYER

[75] Inventor: Shoji Ariizumi, Tokyo, Japan

[73] Assignee: Kabushiki Kaisha Toshiba, Kawaski, Japan

[21] Appl. No.: 96,775

[22] Filed: Sep. 14, 1987

Related U.S. Application Data

[63] Continuation of Ser. No. 811,464, Dec. 20, 1985, abandoned.

[30] Foreign Application Priority Data

Dec. 25, 1984 [JP] Japan .................... 59-278410

[51] Int. Cl.$^4$ .............. H01L 27/02; H01L 27/10; H01L 29/04; H01L 29/34
[52] U.S. Cl. .................................... 357/54; 357/41; 357/45; 357/59; 357/71
[58] Field of Search ............. 357/41, 45, 54, 59, 357/71, 23.1, 23.9; 365/104

[56] References Cited

U.S. PATENT DOCUMENTS 4,277,881  7/1981  Godejohn, Jr. .................. 357/59
4,305,200  12/1981  Fu et al. ........................ 357/41
4,384,345  5/1983  Mikome .......................... 357/45

FOREIGN PATENT DOCUMENTS 0036573  9/1981  European Pat. Off. .
0054102  6/1982  European Pat. Off. .
0124115  11/1984  European Pat. Off. .
56-26470  3/1981  Japan ............................ 357/23.9

OTHER PUBLICATIONS

1979 Int'l Electron Devices Meeting, Technical Digest, "A New Self-Aligned Source/Drain Diffusion Technology from Selectively Oxidized Poly-Silicon" (Washington, D.C., Dec. 3-4-5, 1979).

Primary Examiner—J. Carroll
Attorney, Agent, or Firm—Finnegan, Henderson, Farabow, Garrett and Dunner

[57] ABSTRACT

A semiconductor read only memory device is disclosed, which comprises a plurality of memory cells each including drain and source regions separately formed on a semiconductor substrate of p-conductivity type and a gate electrode insulatively disposed over the semiconductor substrate and extending between the drain and source regions. A poly-silicon layer containing an impurity of the p-conductivity type is formed such that it is contiguous to each drain region. A silicon nitride mask having electric insulation property and antioxidation property is formed selectively on the poly-silicon layer. The poly-silicon layer is oxidized selectively except for portions contiguous to the drain regions in the presence of the silicon nitride masks. An aluminum layer is selectively made in contact with the poly-silicon layer depending on the presence or absence of the silicon nitride layer.

6 Claims, 5 Drawing Sheets

F I G. 6
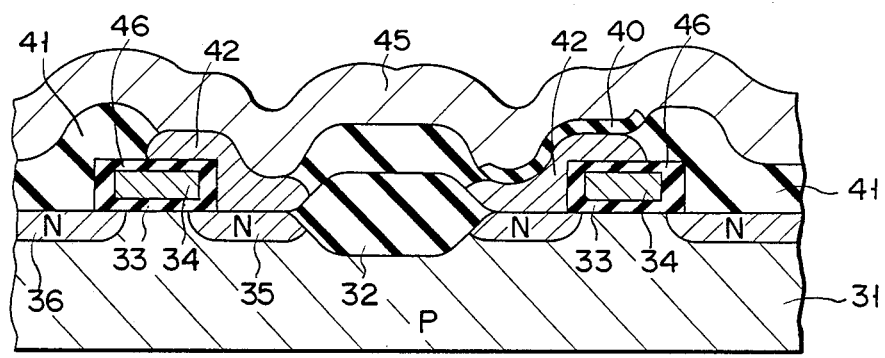
F I G. 8
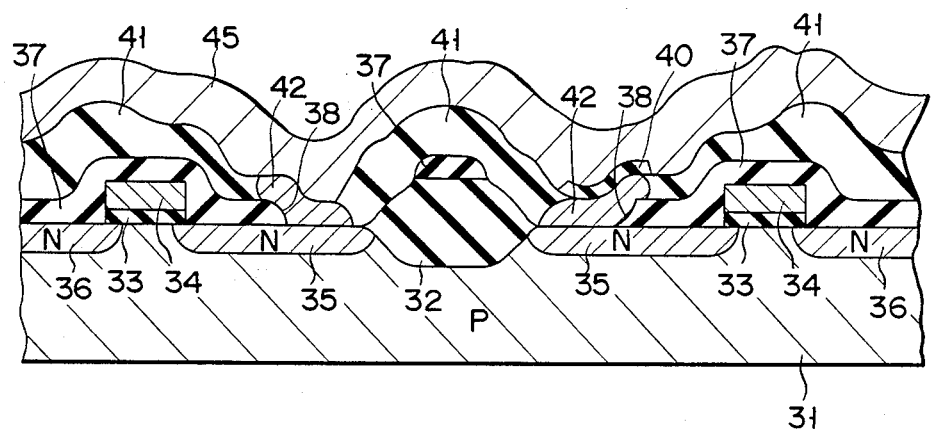

SEMICONDUCTOR READ ONLY MEMORY DEVICE WITH SELECTIVELY PRESENT MASK LAYER

This application is a continuation, of application Ser. No. 811,464, filed 12/20/85, abandoned.

BACKGROUND OF THE INVENTION

This invention relates to a semiconductor read only memory device and a method of manufacturing the same.

In the manufacture of a semiconductor read only memory (ROM), usually data is written in the ROM using a mask during the manufacture. Such a ROM is called mask program ROM. Data is written in the mask program ROM by using one of three, extensively employed data storage systems, i.e., a contact system, in which electrodes are selectively made in contact with memory cells, a SDG system, in which data is written depending on the presence or absence of transistor, and a system, in which the transistor threshold voltage is varied according to write data.

Meanwhile, ROMs are classified with respect to the circuit construction into those of a NOR type and those of a NAND-NOR type. The former ROMs are suited for high speed operation, and the latter for low speed operation.

With respect to the drive system, ROMs are classified into synchronizing ROMs and unsynchronizing ROMs.

The NOR-type ROM, suited for high speed operation, features readiness of circuit design and readiness and reliability of data writing. Further, the contact system is adopted for data writing, because a data writing step is in the latter half of the entire process of manufacture of the ROM.

In a ROM adopting the contact system, e.g., one disclosed in U.S. Pat. No. 603,698, where a wiring layer contiguous to the drain region of a MOS transistor is formed on a semiconductor substrate, a gate electrode is formed on the substrate before an insulation layer is formed on the substrate surface inclusive of the gate electrode. The insulation layer is formed with a contact hole for the drain region by photo-etching. A conductive layer is then formed on the insulation layer inclusive of the portion of the drain region exposed by the contact hole. The contact layer is patterned by photo-etching using a mask, whereby a contact electrode is formed in the drain region.

An insulation layer is formed on the entire surface of the semiconductor structure thus obtained. The insulation layer is selectively removed according to write data by photo-engraving process using a mask. A contact electrode contiguous to each intended drain region is thus exposed. Subsequently, aluminum wiring is connected to each exposed contact electrode to complete a ROM where data lines are formed.

In the above ROM, however, the processes of forming the contact electrode contiguous to each drain region and aluminum wiring require mask registration. The mask registration requires a certain margin. Therefore, when the number of mask registration processes is increased, it becomes impossible to realize a high density ROM.

SUMMARY OF THE INVENTION

The present invention seeks to provide a read only memory device, with permits memory cell size reduction and integration density increase without greatly changing the manufacturing process.

According to the invention, an insulating layer formed on a semiconductor substrate, on which MOS transistors constituting respective memory cells are formed, is selectively etched to form contact holes on drain regions. A poly-silicon layer is then formed on the insulation layer. At this time, the poly-silicon layer is made in contact with the drain regions via the contact holes. A silicon nitride layer is then formed on the poly-silicon layer. The silicon nitride layer is selectively removed according to write data. The poly-silicon layer is selectively oxidized with the patterned silicon layer used as a mask, whereby electrodes in contact with the drain regions are formed.

BRIEF DESCRIPTION OF THE DRAWINGS

FIG. 6 is a sectional view showing a still further embodiment of the semiconductor read only memory device;

FIG. 8 is a sectional view of the semiconductor read only memory device of a still further embodiment.

DETAILED DESCRIPTION OF THE INVENTION

Figure 1A:
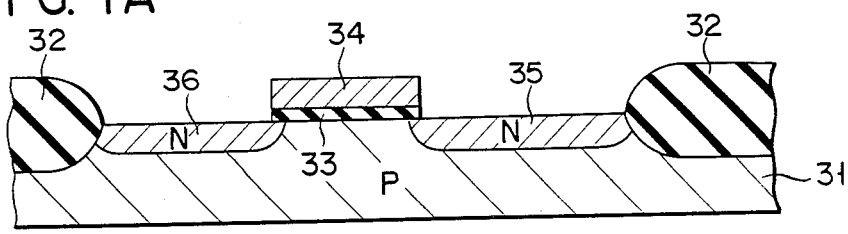
FIGS. 1A to 1E are views showing semiconductor structures in a process of manufacture of an embodiment of the semiconductor read only memory device according to the invention.

FIGS. 1A to 1E illustrate a process of manufacturing a semiconductor read only device. As shown in FIG. 1A, p-type silicon substrate 31 is selectively oxidized to form field oxide layer 32 on it. Gate oxide layer 33 is then formed selectively on substrate 31. Then, on gate oxide layer 33 is formed gate electrode 34 made of a poly-silicon layer containing phosphorus. Gate electrode 34 is formed by a chemical vapor deposition process (CVD) or a photo-engraving process. The poly-silicon layer may be doped with phosphorus after the formation of gate oxide layer 33 if phosphorus is not initially contained.

An n-type impurity, arsenic ions for instance, is then implanted into substrate 31 with poly-silicon gate electrode 34 used as a mask, whereby drain and source regions 35 and 36 are formed.

Figure 1B:
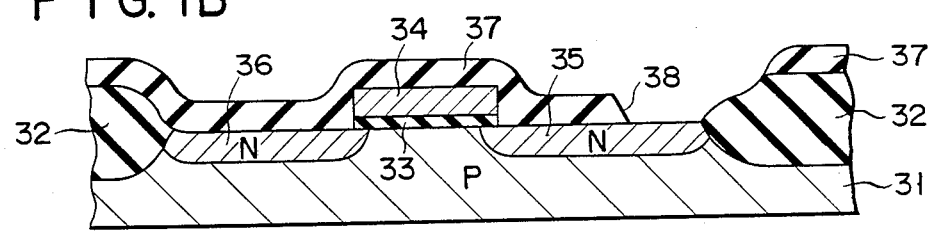

Subsequently, insulation layer 37, as shown in FIG. 1B, having a thickness of about 3,000 Å, is formed over the entire surface of substrate 31 by the CVD process in a low- or high-temperature oxidizing atmosphere. Insulating layer 37 is then formed in a portion corresponding to source region 35 with contact hole 38 by a photo-engraving process.

Figure 1C:
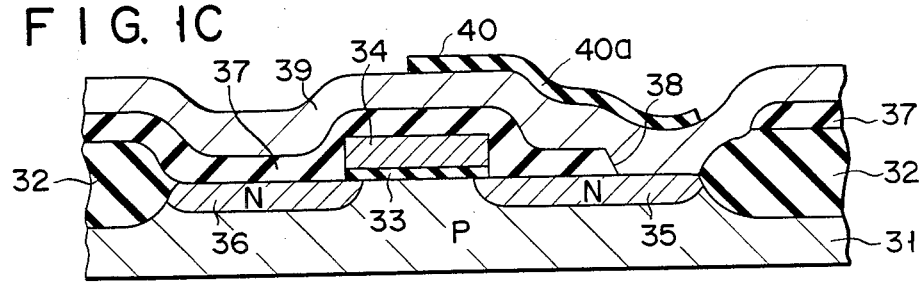

Contact layer 39, as shown in FIG. 1C, is then formed on the entire top surface of the semiconductor structure shown in FIG. 1B. Where conductive layer 39 is formed from a poly-silicon layer, ions are implanted into the poly-silicon layer or an impurity is diffused in it, thus reducing the resistance of the poly-silicon layer and also reducing the resistance of the junction between the poly-silicon layer 39 and drain region 35. Silicon nitride layer 40 with a thickness of about 1,000 Å, is then formed by the CVD process for instance, on conductive layer 39. Silicon nitride layer 40 is then patterned to form silicon nitride film 40a as a mask for a contact electrode. Silicon nitride layer 40 is patterned at this time such that silicon nitride film 40a from the area of contact hole 38 in drain region 35 to an area covering a portion of gate electrode 34.

Figure 1D:
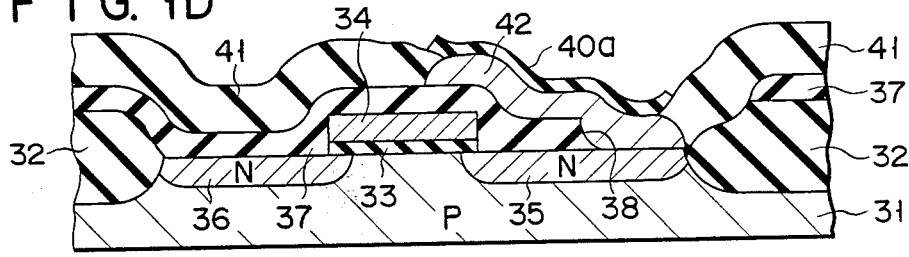
Figure 1E:
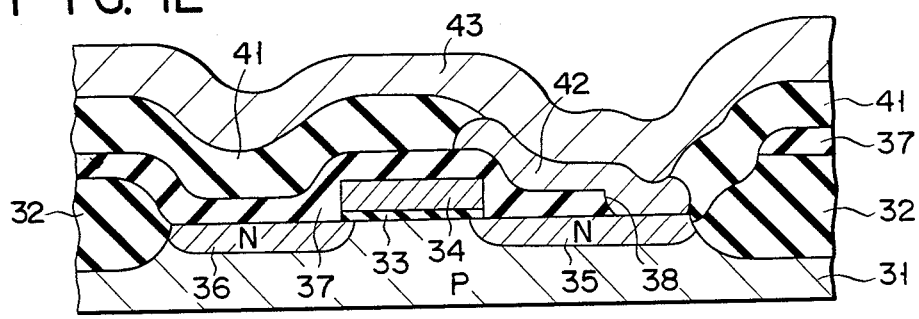

The semiconductor structure thus obtained, shown in FIG. 1C, is then thermally oxidized in an atmosphere at 900° to 1,000° C., whereby poly-silicon layer 39 is oxidized except for its portion under silicon nitride film 40, as shown in FIG. 1D. As a result, poly-silicon layer 39 is divided into oxide layer 41 and conductive layer 42. Conductive layer 42 has a portion contiguous with drain region 35 in contact hole 38, while the rest of it extends over silicon gate electrode 34. It is to be noted that oxide layer 41 and contact layer 42 are formed simultaneously such that they are self-aligned by mask 40.

Silicon nitride mask 40a of the semiconductor structure shown in FIG. 1D, is then selectively removed, according to write data. In this case, a photoresist layer is formed over silicon nitride film 40a and conductive layer 42 and then is selectively removed by the photoengraving process using a mask corresponding to the write data. Silicon nitride film 40a over drain region 35 to be connected to data line is removed, shown in FIG. 1E, while that which is on drain region 35 not connected to data line is left. Subsequently, aluminum layer 43 is formed over the entire top surface of the semiconductor structure. Aluminum layer 43 is patterned into data lines.

Figure 2:
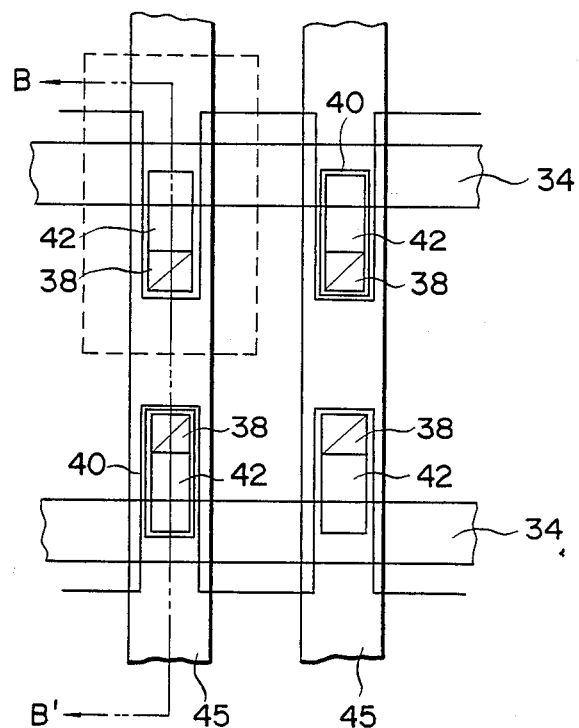
FIG. 2 is a plan view showing the same semiconductor read only memory device.
Figure 3:
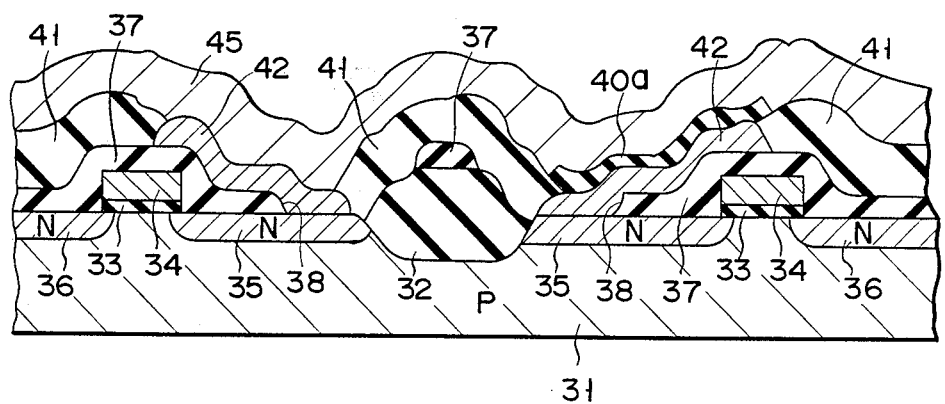
FIG. 3 is a sectional view of the semiconductor read only memory device.

FIG. 2 is a plan view showing a ROM obtained by the process shown in FIGS. 1A to 1E. FIG. 3 is a section taken along line B—B' in FIG. 2. In the ROM structure shown in FIGS. 2 and 3, poly-silicon layer 34 constitutes word lines, and data lines 45 are formed by patterning process of aluminum layer 43. A memory cell is shown enclosed in a dashed rectangle. In the ROM shown in FIG. 3, in the left side ROM drain region 35 is connected to data line 45 by poly-silicon layer 42. On the other hand, on the right side memory cell drain region 35 is not connected to data line 45 because of the presence or nitride layer 40a between data line 45 and poly-silicon 42.

With the ROM described above according to the invention, when electrode film 42 contiguous to drain regions is selectively connected to aluminum data line 45, nitride film 40a used to form electrode films 42 is selectively removed, and aluminum wiring for the drain regions is done depending on the presence or absence of the nitride films 40a. For this reason, no contact holes are needed for the aluminum wiring, that is, no margin for contact holes is necessary. Integration density, thus can be improved.

Since aluminum wiring layer 45 and contact film 42 are made contiguous with one another without agency of any contact hole, fining patterning of the aluminum wiring layer will not lead to a problem of contact resistance increase due to aluminum layer grain size. Since no contact hole is formed, contact film 42 and insulating layer 41 are free from stepped portions. It is thus possible to eliminate otherwise possible disconnection of data lines at stepped portion. In addition, the thickness of the aluminum wiring layer may be reduced, so that it is possible to avoid the problem of electro-migration of aluminum.

Figure 4:
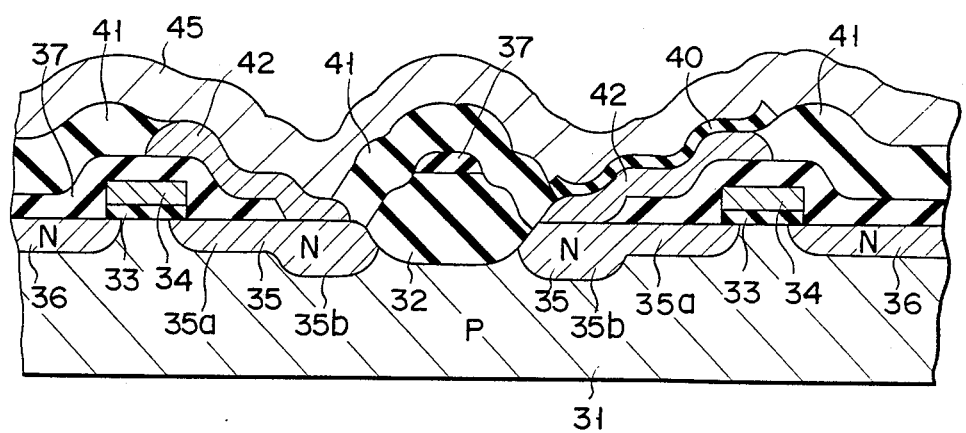
FIG. 4 is a sectional view of the semiconductor read only memory device at a further embodiment.

FIG. 4 shows a different embodiment of the invention. In this instance, drain region 35 includes region 35a having the same depth as the source region and region 35b deeper than region 35a. Deeper region 35b is contiguous to field oxide layer 32. Further, unlike the embodiment of FIG. 3, poly-silicon layer 42 is doped an impurity different from the impurity contained in drain region 35, e.g., phosphorus. In this case, phosphorus introduced into poly-silicon layer 42 is re-diffused into drain region 35 in diffusion process, whereby drain region 35 is formed from deeper drain region 35b.

Figure 5:
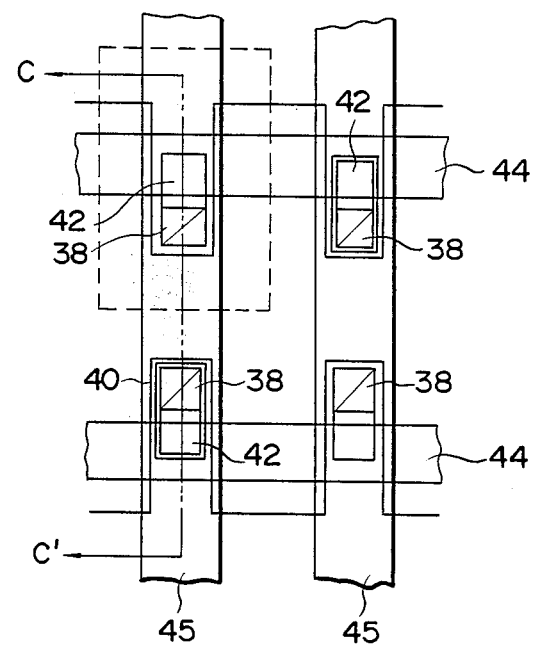
FIG. 5 is a plan view showing the memory device shown in FIG. 4.
Figure 7A:
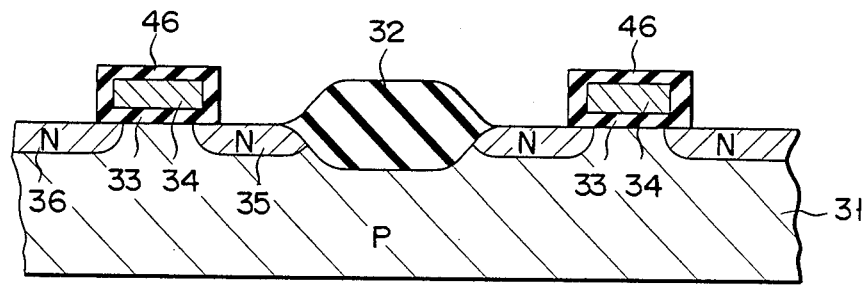
FIGS. 7A and 7B show semiconductor structures in processes of manufacture of the semiconductor ROM shown in FIG. 6.
Figure 7B:
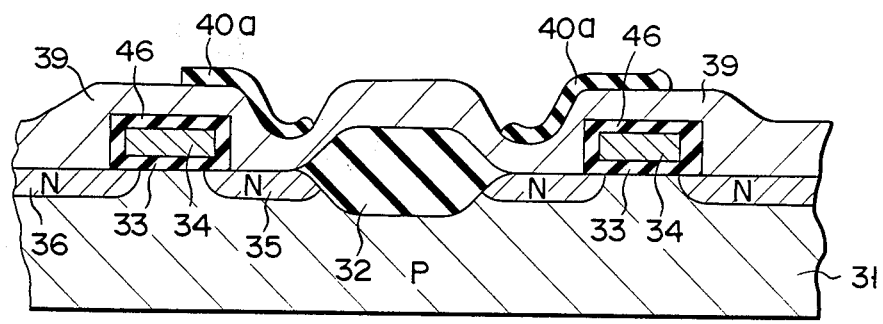

FIGS. 5 and 6 show a further embodiment of the invention. In this instance, the entire surface of the semiconductor structure shown in FIG. 1A is thermally oxidized, whereby poly-silicon gate electrode 34 is enclosed in insulation layer 46, as shown in FIG. 7A. Then, poly-silicon layer 39 is formed on semiconductor structure 31, as shown in FIG. 7B. Then, nitride films 40a are selectively formed on poly-silicon 39 in the same manner as described before in connection with FIG. 1C. Subsequently, processes as described before in connection with FIGS. 1D and 1E are performed to obtain the ROM.

FIG. 8 shows a further embodiment. In this instance, poly-silicon contact film 42 under nitride film 40a does not extend up to the region of gate electrode 34, but is substantially confined in contact hole 38 provided on drain region 35. Even with this structure, a sufficient area of contact between data line 45 and contact film 42 can be obtained.

In the embodiments described above, the gate electrode of the MOS transistor functioning as memory cell, i.e., the word line, is constituted by poly-silicon. However, it is also possible to form word lines having a double-layer structure formed of a high-melting metal, e.g., molybdenum silicide, and poly-silicon. Generally, the layer may be made of a conductive material which can contain impurities.

Further, the above embodiments have concerned with the N-channel ROMs using a p-type semiconductor substrate. However, this is by no means limitative, and the invention is applicable to either an n-well C MOS structure ROM using a p-type semiconductor substrate or to a C MOS structure ROM where a p-well is formed in an n-type semiconductor substrate.

What is claimed is:

1. A semiconductor read only memory device comprising:

a plurality of memory cells each including a pair of semiconductor regions separately formed on a semiconductor substrate of a first conductivity type, said semiconductor regions having a second conductivity type opposite to said first conductivity type, and a gate electrode insulatively disposed over said semiconductor substrate and extending between said pair of semiconductor regions;

a first conductive layer contiguous to one of said semiconductor regions of each of said memory cells, and containing an impurity of said second conductivity type;

a mask layer formed over said first conductive layer and having an electric insulation property and an anti-oxidation property, said mask layer being selectively removed according to write information; and a second conductive layer formed on the surface of said first conductive layer inclusive of said mask layer and selectively contiguous to said first conductive layer depending on the presence or absence of said mask layer.

2. The semiconductor read only memory device according to claim 1, wherein said first conductive layer is made of a poly-silicon layer.

3. The semiconductor read only memory device according to claim 1, wherein said mask layer is made of silicon nitride.

4. A semiconductor read only memory device comprising:
- a plurality of memory cells each including a pair of semiconductor regions separately formed on a semicondcutor substrate type, and a gate electrode insulatively disposed over said semiconductor substrate and extending between said pair of semiconductor regions;
- a plurality of first conductive layers, each insulatively formed over said gate electrode and contiguous to one of said pair of semiconductor regions of each of said memory cells, and each containing an impurity of said second conductivity type;
- a plurality of mask layers, formed over said plurality of first conductive layers and having an electric insulation property and an anti-oxidation property, said mask layers bieng selectively removed according to write information; and
- a plurality of second conductive layers formed on the surface of said plurality of first conductive layers inclusive of said plurality of mask layers and selectively contiguous to said first conductive layers depending on the presence or absence of said mask layers.

5. The semiconductor read only memory device according to claim 1, wherein each of said first conductive layers is made of a poly-silicon layer.

6. The semiconductor read only memory device according to claim 1, wherein each of said mask layers is made of silicon nitride.

* * * * *